United States Patent [19]

Yoshida et al.

[11] Patent Number: 5,475,831
[45] Date of Patent: Dec. 12, 1995

[54] PARALLEL TO SERIAL DATA TRANSFER SYSTEM HAVING REDUCED DATA PROCESSING UNIT HEAD

[75] Inventors: Hiroshi Yoshida; Kenji Nakahara, both of Tokyo, Japan

[73] Assignee: NEC Corporation, Japan

[21] Appl. No.: 905,537

[22] Filed: Jun. 29, 1992

[30] Foreign Application Priority Data

Jun. 29, 1991 [JP] Japan ................................. 3-185224

[51] Int. Cl.[6] .................................................. G06F 5/01
[52] U.S. Cl. .................... 395/500; 377/81; 364/DIG. 1; 364/DIG. 2; 364/259; 364/259.5; 364/947; 364/947.6
[58] Field of Search ................. 364/DIG. 1 MS File, 364/DIG. 2 MS File; 395/200, 250, 275, 325, 500, 800; 377/64, 66, 70, 73, 77, 78, 80, 81

[56] References Cited

U.S. PATENT DOCUMENTS 3,753,241   8/1973   Bayne .................................... 395/250

Primary Examiner—Robert B. Harrell
Attorney, Agent, or Firm—Ostrolenk, Faber, Gerb & Soffen

[57] ABSTRACT

A parallel to serial data transfer system includes a CPU for continuously supplying parallel data of plural bytes, a buffer for storing the parallel data transferred from the CPU, a shift resister for loading the parallel data to be converted into serial data, and a selector. The buffer supplies an empty flag to the selector when no data is stored therein, so that the selector supplies a signal to the buffer and the shift resister in order to prohibit a load of parallel data from the buffer to the shift resister.

3 Claims, 2 Drawing Sheets

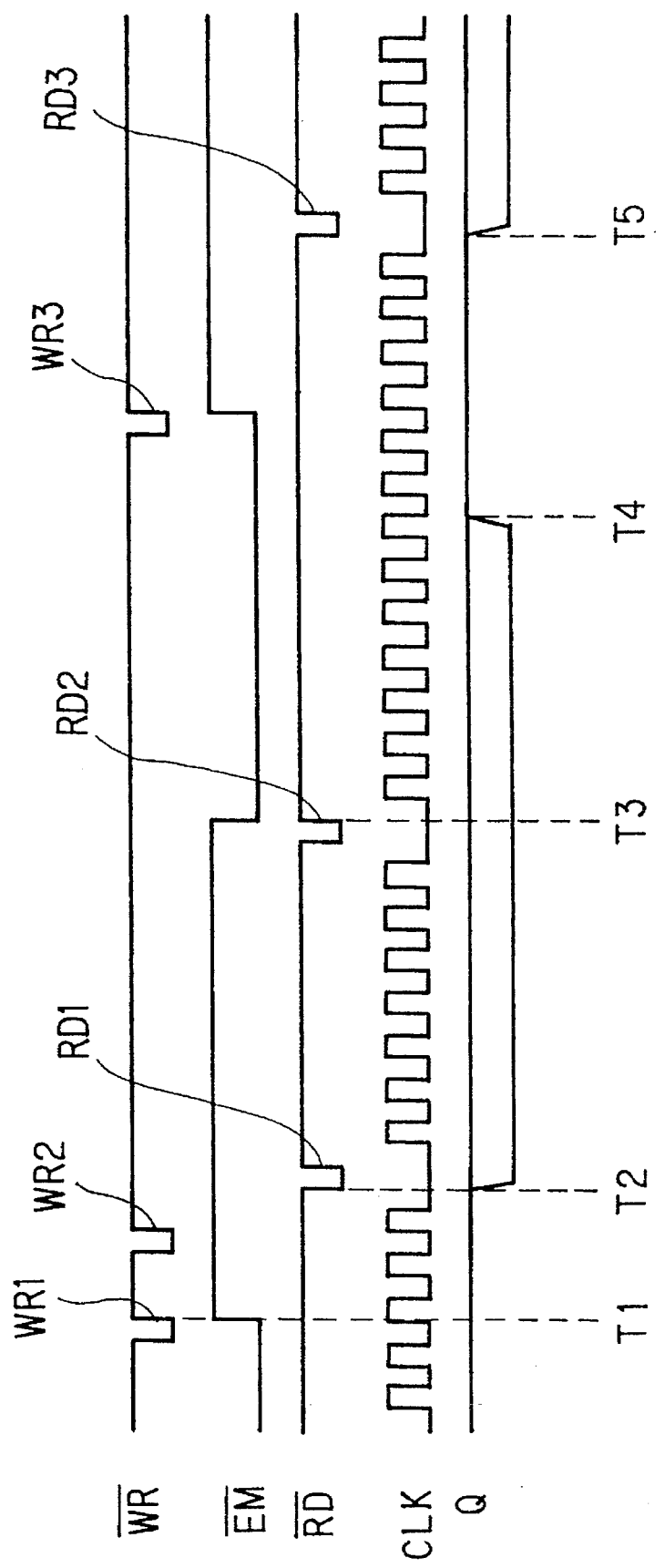

PARALLEL TO SERIAL DATA TRANSFER SYSTEM HAVING REDUCED DATA PROCESSING UNIT HEAD

FIELD OF THE INVENTION

This invention relates to a parallel to serial data transfer system, and more particularly to, a parallel to serial data transfer system for transferring burst serial data by receiving parallel data.

BACKGROUND OF THE INVENTION

A conventional parallel to serial data transfer system includes a CPU (central processing unit) for supplying parallel data of one byte at a time, a buffer connected to the CPU for storing the parallel data transferred from the CPU, and a parallel to serial shift resister connected to the buffer for converting parallel data to serial data.

In operation, when a write request-signal is supplied to the CPU, parallel data of one byte is transferred from the CPU to the buffer. Then, the parallel data is loaded from the buffer to the parallel to serial shift resister. After that, the parallel data of one byte loaded in the shift resister is read therefrom one bit by one bit in synchronism with a clock signal. Thus, the parallel data are converted to serial data.

According to the conventional parallel to serial data transfer system, however, there are disadvantages in that the lead of the CPU becomes large, because the CPU has to access the buffer every time one byte is transferred in response to the write request signal, so that the CPU has to access the buffer "m" times in the case of the data transfer of "m" bytes. Further, if the buffer has a memory capacity of "n" bytes more than "m" bytes of parallel data transferred from the CPU, the "n-m" bytes has to be filled with dummy data, so that the lead of the CPU becomes larger.

SUMMARY OF THE INVENTION

Accordingly, it is an object of the invention to provide a parallel to serial data transfer system in which the lead of the CPU is decreased, and the control of the CPU becomes simplified.

According to the invention, a parallel to serial data transfer system, including:
  a data processing unit for supply of parallel data of "m" bytes in a successive manner, where "m" is an integer equal to or larger than 1;
  a buffer for holding the parallel data of "m" bytes, the buffer having a capacity of "n" bytes, where "n" is an integer equal to or larger than 1, and for generating an empty flag, when no parallel data is held therein;
  a shift register for supply of serial data of "m" bytes by being loaded with the parallel data of "m" bytes in a successive manner, and for supply of a constant value, when no parallel data is loaded therein; and
  a control circuit for prohibiting a load of parallel data to the shift register, when the empty flag is generated.

BRIEF DESCRIPTION OF THE DRAWINGS

The invention will be explained in more detail in conjunction with appended drawings; wherein:

FIG. 3 is a timing chart showing operation of the preferred embodiment.

DESCRIPTION OF THE PREFERRED EMBODIMENTS

Before describing a parallel to serial data transfer system according to the invention, the briefly aforementioned conventional parallel to serial data transfer system will be explained.

Figure 1:
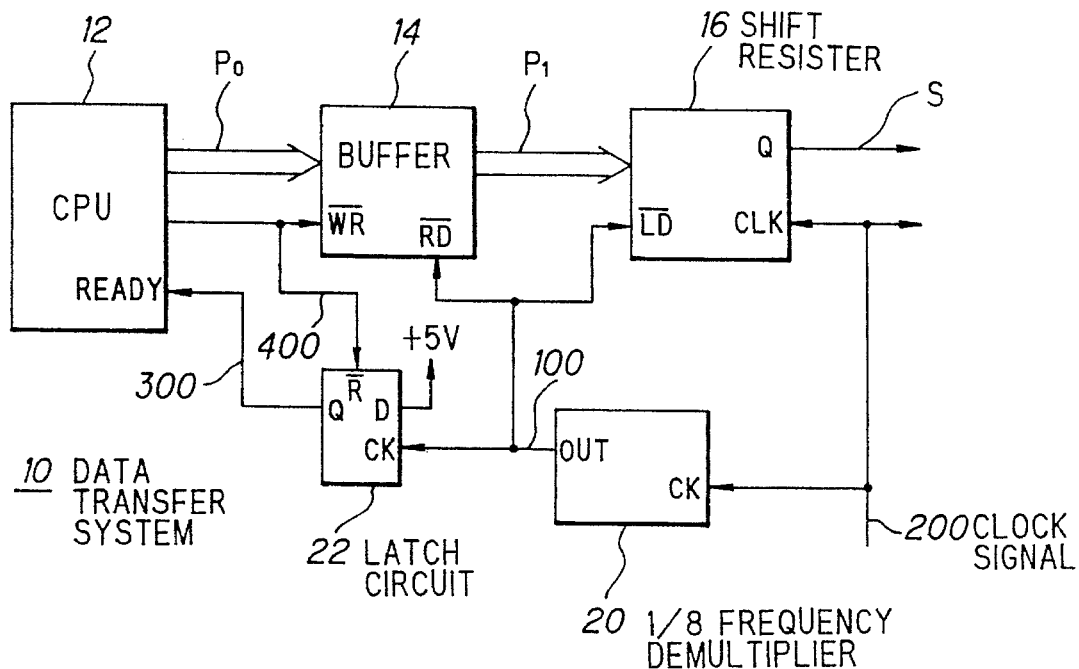
FIG. 1 is a circuit diagram showing a conventional parallel to serial data transfer system.

FIG. 1 shows the conventional parallel to serial data transfer system 10 which includes a CPU (central processing unit) 12 for supplying parallel data "$P_0$" one byte by one byte, a buffer 14 connected to the CPU 12 for storing the parallel data "$P_0$" and transferring parallel data "$P_1$" one byte by one byte, a parallel to serial shift resister 16 connected to the buffer 14 for converting the parallel data "$P_0$" into serial data "S", a ⅛ frequency demultiplier 20 for supplying a load signal 100 to the buffer 14 and the shift resister 16 in accordance with a clock signal 200, and a latch circuit 22 connected to the CPU 12 and to the ⅛ frequency demultiplier 20 for supplying a write request signal 300 to the CPU 12 in response to the load signal 100.

In operation, when eight pulses of the clock signal 200 are supplied to the ⅛ frequency demultiplier 20, a load signal 100 is supplied to the latch circuit 22, to the buffer 14 and to the shift resister 16. In response to the load signal 100, the latch circuit supplies a write request signal 300 to the CPU 12, so that parallel data "$P_0$" of one byte is transferred to the buffer 14 in accordance with a write signal 400. At this time, a write signal 400 is supplied to a reset terminal of the latch circuit 22, so that the latch circuit 22 is reset.

Then, in response to the load signal 100, a parallel data "$P_1$" is transferred from the buffer 14 to the shift resister 16, and the parallel data "$P_1$" of one byte is transferred from the serial shift resister 16 one bit by one bit in synchronism with the clock signal 200, so that the parallel to serial conversion of the transfer data is made.

According to the conventional parallel to serial data transfer system 10, however, there are disadvantages in that the load of the CPU 12 becomes large, because the CPU 12 has to access the buffer 14 for each one byte transfer in response to the write request signal 300. Further, if the buffer 14 has a memory capacity of "n" bytes more than "m" bytes of parallel data transferred from the CPU 12, the buffer 14 has to be controlled in order that data of "n-m" bytes are not accessed, so that the control of the CPU 12 becomes complicated.

Figure 2:
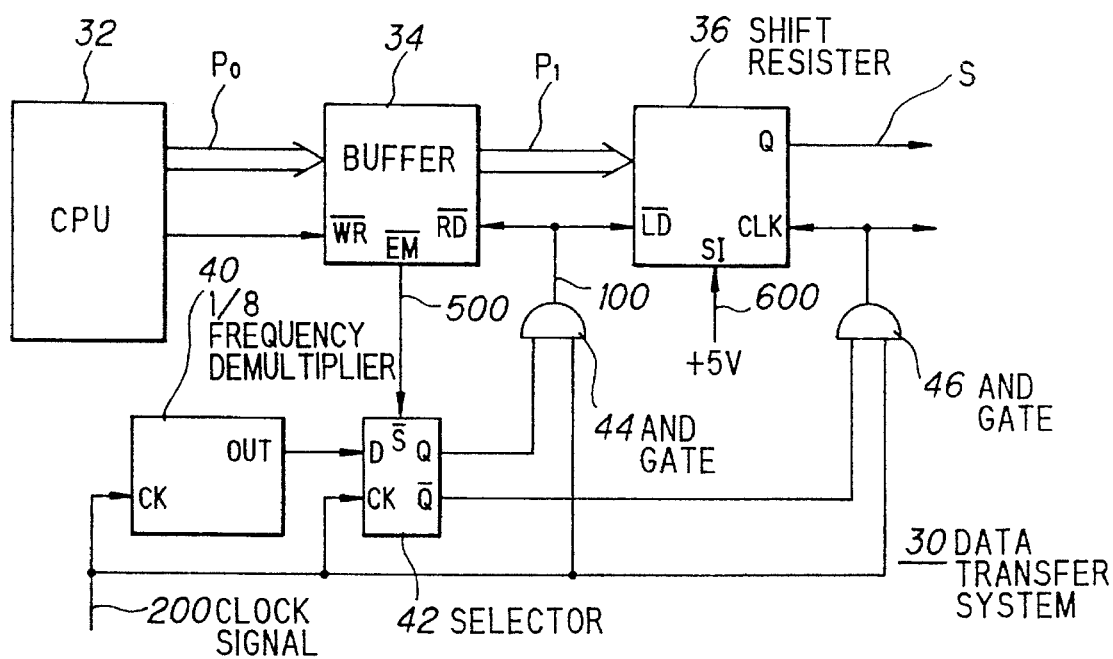
FIG. 2 is a circuit diagram showing a parallel to serial data transfer system of a preferred embodiment according to the invention.

FIG. 2 shows a parallel to serial data transfer system 30 of a preferred embodiment according to the invention, which includes a CPU (central processing unit) 32 for supplying parallel data "$P_0$" continuously byte by byte, a buffer 34 connected to the CPU 32 for storing the parallel data "$P_0$" and transferring parallel data "$P_1$" byte by byte, a shift resister 36 connected to the buffer 34 for converting the parallel data into serial data "S", a ⅛ frequency demultiplier 40 for supplying an output signal for eight pulses of a clock signal 200, a selector connected to the buffer 34 and the ⅛ frequency demultiplier 40, an AND gate 44 connected at inputs to a non-inverted output of the selector 42 and to the clock signal 200 and at an output to the buffer 34 and the shift resister 36, and an AND gate 46 connected at inputs to an inverted output of the selector 42 and to the clock signal 200 and at an output to the shift resister 36.

The buffer 34 supplies an empty flag 500 to the selector 42, when no parallel data is stored therein. The parallel to serial shift resister 36 is supplied with a constant serial voltage, so that a constant serial data is supplied from the Q output of the shift resister 36, when eight pulses of the clock signal 200 are counted at the state where the empty flag is low.

Next, operation of the preferred embodiment will be explained in conjunction with FIG. 3. When parallel data "$P_0$" of two bytes are transferred from the CPU 32 to the buffer 34 by the write signals WR1 and WR2, the two parallel data "$P_0$" are successively written therein. At the time "T1", an empty flag 500 (EM) becomes high level to be supplied from the buffer 34 to the selector 42. On the other hand, when eight pulses of the clock signal 200 are supplied to the ⅛ frequency demultiplier 40, an output signal is supplied from the ⅛ frequency demultiplier 40 to the selector 42. Thus, the non-inverted output of the selector 42 is supplied to the AND gate 44 and the inverted output is supplied to the AND gate 46, so that a read and load signal 100 is supplied to the buffer 34 and to the shift resister 36 at a time T2, as shown by "RD1" in FIG. 3. Then, the first parallel data "$P_0$" stored in the buffer 34 is transferred to the shirt resister 36 as parallel data "$P_1$".

The parallel data loaded into the shift register 36 is shifted out therefrom bit by bit, so that a serial data "S" is supplied from the Q output thereof by eight pulses of the clock signal 200. Then, the read signal RD2, as shown in FIG. 3, is generated together with the load signal in accordance with the output 100 of the AND gate 44 at the time T3, so that the second parallel data $P_1$ is transferred, from the buffer 34 to the shift register 36. Thus, an eight bit serial data "S" is obtained at the Q output of the shirt register 36 in the same manner as the first parallel data. At the time T3, the buffer 3 becomes empty, so that the empty flag EM becomes low. At this state, eight pulses of the clock signal 200 are counted until the time T4, during which pulses a constant serial data is generated at the Q output of the shift register 36 in accordance with the voltage 600 applied to the S1 terminal, and is finished at the time T5. The read signal RD3 is generated to retrieve the data placed in buffer 34 by the write signal WR3. Subsequently, the parallel data written into the buffer 34 by the signal WR3 and loaded into the shift register 36 by the signal RD3 is shifted out from the shift register 36 bit by bit as an eight bit serial data.

As described above, "m" bytes of parallel data can be successively written from a CPU to a buffer having a capacity of "n" bytes (m≦n) without access of the CPU to the buffer for each byte, and the supply of a serial data from a shift register is controlled by an empty flag generated by the buffer, so that the load of the CPU is decreased. In addition, the CPU may write "m" bytes of parallel data in a burst manner to the buffer in a predetermined time, during which the "m" bytes of serial data are supplied from the shift register, so that the CPU is not required to have a write request signal to simplify the control of the CPU.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A parallel to serial data transfer system, comprising:

a data processing unit for supply of parallel data of "m" bytes in a successive manner, where "m" is an integer equal to or larger than 1;

a buffer for receiving said parallel data of "m" bytes from said data processing unit and holding said parallel data of "m" bytes, said buffer having a capacity of "n" bytes, where "n" is an integer equal to or larger than "m", said buffer also for generating an empty flag when no parallel data is held therein;

a control circuit for prohibiting a load of parallel data to a shift register, when said empty flag is generated and for generating a read signal as a function of said empty flag; and a shift register for generating serial data of "m" bytes by being loaded with said parallel data of "m" bytes in a successive manner from said buffer when said read signal is not generated and said empty flag is not generated, and said shift register for generating a constant value a predetermined number of clocks after said empty flag is generated.

2. A parallel to serial data transfer system, according to claim 1, wherein:

said control circuit, comprises:

a frequency demultiplier for dividing a frequency of a clock signal to generate a divided frequency signal; and a selector for generating a load signal by receiving said divided frequency signal, said shift register being loaded with said parallel data by said load signal, and said selector being prohibited to load said parallel data to said shift register by said empty flag.

3. A parallel to serial data transfer system, according to claim 1, wherein:

said data processing unit accesses said buffer for supply of said parallel data of "m" bytes thereto without receiving any access request signal for each of "m" bytes.

* * * * *

UNITED STATES PATENT AND TRADEMARK OFFICE
CERTIFICATE OF CORRECTION

PATENT NO. : 5,475,831
DATED : December 12, 1995
INVENTOR(S) : Hiroshi Yoshida and Kenji Nakahara It is certified that error appears in the above-indentified patent and that said Letters Patent is hereby corrected as shown below:

ON THE TITLE PAGE:

Item [54], the title "PARALLEL TO SERIAL DATA TRANSFER SYSTEM HAVING REDUCED DATA PROCESSING UNIT HEAD" should read --PARALLEL TO SERIAL DATA TRANSFER SYSTEM HAVING REDUCED DATA PROCESSING UNIT LOAD--.

Signed and Sealed this

Fourteenth Day of May, 1996

*Attest:*

BRUCE LEHMAN

*Attesting Officer*  *Commissioner of Patents and Trademarks*